United States Patent
Li et al.

(10) Patent No.: US 6,624,457 B2
(45) Date of Patent: Sep. 23, 2003

(54) STEPPED STRUCTURE FOR A MULTI-RANK, STACKED POLYMER MEMORY DEVICE AND METHOD OF MAKING SAME

(75) Inventors: Jian Li, Sunnyvale, CA (US); Xiao-Chun Mu, Saratogo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/909,670

(22) Filed: Jul. 20, 2001

(65) Prior Publication Data

US 2003/0015740 A1 Jan. 23, 2003

(51) Int. Cl.[7] .............................................. H01L 31/119
(52) U.S. Cl. ..................... 257/295; 257/295; 257/324; 365/8
(58) Field of Search ..................... 257/295; 365/114, 365/163, 158, 201, 112, 159

(56) References Cited

U.S. PATENT DOCUMENTS

| | | | | |
|---|---|---|---|---|
| 4,538,884 A | * | 9/1985 | Masaki ........................ | 350/361 |
| 4,873,455 A | * | 10/1989 | de Chambost et al. ...... | 307/201 |
| 5,499,206 A | * | 3/1996 | Muto .......................... | 365/114 |
| 6,072,716 A | * | 6/2000 | Jacobson et al. ............ | 365/163 |
| 6,194,229 B1 | * | 2/2001 | Basceri ........................... | 438/3 |
| 2001/0000005 A1 | * | 3/2001 | Forrest et al. .......... | 204/192.12 |
| 2002/0024835 A1 | * | 2/2002 | Thompson et al. .......... | 365/117 |
| 2002/0044480 A1 | * | 4/2002 | Gudesen ...................... | 365/145 |

OTHER PUBLICATIONS

Borca, C., et al., "Influence of dynamical scattering in crystalline poly (vinylidene fluoride–trifluoroethylene) copolymers", *Applied Physics Letters*, vol. 74, 347–349, (Jan. 18, 1999).

Borca, C., et al., "Lattice–Stiffening Transition in Copolymer Films of Vinylidene Fluoride (70%) with Trifluoroethylene (30%)", *Physical Review Letters*, 4562–4565, (Nov. 29, 1999).

Bune, A., et al., "Piezoelectric and pyroelectric properties of ferroelectric Langmuir–Blodgett polymer films", *Journal of Applied Physics*, vol. 85, 7869–7873, (Jun. 1, 1999).

Bune, A., et al., "Two–dimensional ferroelectric films", *Nature*, vol. 391, 874–877, (Feb. 26, 1998).

Choi, J., et al., "Phase transition in the surface structure in copolymer films of vinylidene fluoride (70%) with trifluoroethylene (30%)", *Physical Review B*, vol. 61, 5760–5770, (Feb. 15, 2000).

Desu, S., "Minimization of Fatigue in Ferroelectric Films", *Phys. Stat. Sol.* (*a*) *151*, 467–480, (1995).

Ducharme, S., et al., "Ultrathin Ferroelectric Polymer Films", *Ferroelectrics*, vol. 202, 29–37, (1997).

Lovinger, A.J., "Ferroelectric Polymers", *Science*, vol. 220, 1115–1121, (Jun. 10, 1983).

Morikawa, E., et al., "Photoemission study of direct photomicromachining in poly (vinylidene fluoride)", *Journal of Applied Physics*, vol. 87, 4010–4016, (Apr. 15, 2000).

* cited by examiner

Primary Examiner—David Nelms
Assistant Examiner—Thinh T. Nguyen
(74) Attorney, Agent, or Firm—Blakely, Sokoloff, Taylor & Zafman LLP

(57) ABSTRACT

The present invention relates to a ferroelectric polymer storage device including at least two stacked ferroelectric polymer memory structures that are arrayed next to at least two respective stacked topologies that are a pre-fabricated silicon substrate cavity that includes interlayer dielectric layers and via structures.

22 Claims, 15 Drawing Sheets

US 6,624,457 B2

STEPPED STRUCTURE FOR A MULTI-RANK, STACKED POLYMER MEMORY DEVICE AND METHOD OF MAKING SAME

BACKGROUND OF THE INVENTION

1. Field of the Invention

The present invention relates generally to microelectronic device fabrication. More particularly, the present invention relates to fabrication of a microelectronic storage device. In particular, the present invention relates to a multi-rank, stacked cross-point ferroelectric polymer memory device.

2. Description of Related Art

In the microelectronics field, continual pressure exists to find faster, denser, and more cost-effective solutions to data storage. One particular area of interest is higher storage capacity per unit area of a substrate. Whether the data storage is fast, on-die storage such as static random access memory (SRAM), whether it is the somewhat slower embedded dynamic random access memory (eDRAM), the even slower off-die dynamic random access memory (DRAM), or whether it is magnetic- or magneto optical disks for mass storage, each technology is constantly being advanced to meet the demand for increased speed and capacity, and for lower voltage operation.

It was discovered that some polymers exhibit ferromagnetism. One such polymer is poly vinylidene fluoride (PVDF, whose repeat formula is $(CH_2-CF_2)_n$) and some of its copolymers.

Ferroelectric properties are discoverable below the temperature of the ferroelectric phase transition, which is the working temperature upper limit. Below this temperature, the main chain of a ferroelectric polymer may be arranged in the substantially all-trans configuration such that dipole moments are parallel, at least, within ferroelectric domains that are separated from each other by domain walls. Ferroelectric polymers form chain lengths that may be in the range of about one micro meter (micron).

One activity involved in operation of a ferroelectric polymer data storage device relates to increasing storage capacity for a given substrate.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a multi-rank, stacked ferroelectric polymer storage device. The invention may include a ferroelectric polymer layer that is sandwiched between two series of electrodes that achieve electrical signaling across the ferroelectric polymer layer. With the knowledge of the ferromagnetic qualities of such polymers, the inventors ventured to take advantage of the ability to orient ferromagnetic polymer layers as a data storage device.

In some applications, the ferroelectric polymer device may preferably be stacked ferroelectric polymer structures. Because of higher per-unit-substrate-area storage incentives, the inventors looked to fabricating a multi-rank ferroelectric polymer memory device.

In multi-layer design, there is a restriction to using conventional integrated circuit interconnect fabrication technology which requires high-temperature chemical vapor deposition such as up to about 500° C., to form interlayer dielectrics and vias such as a tungsten (W) via. As these high temperatures, polymer layers would be damaged.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
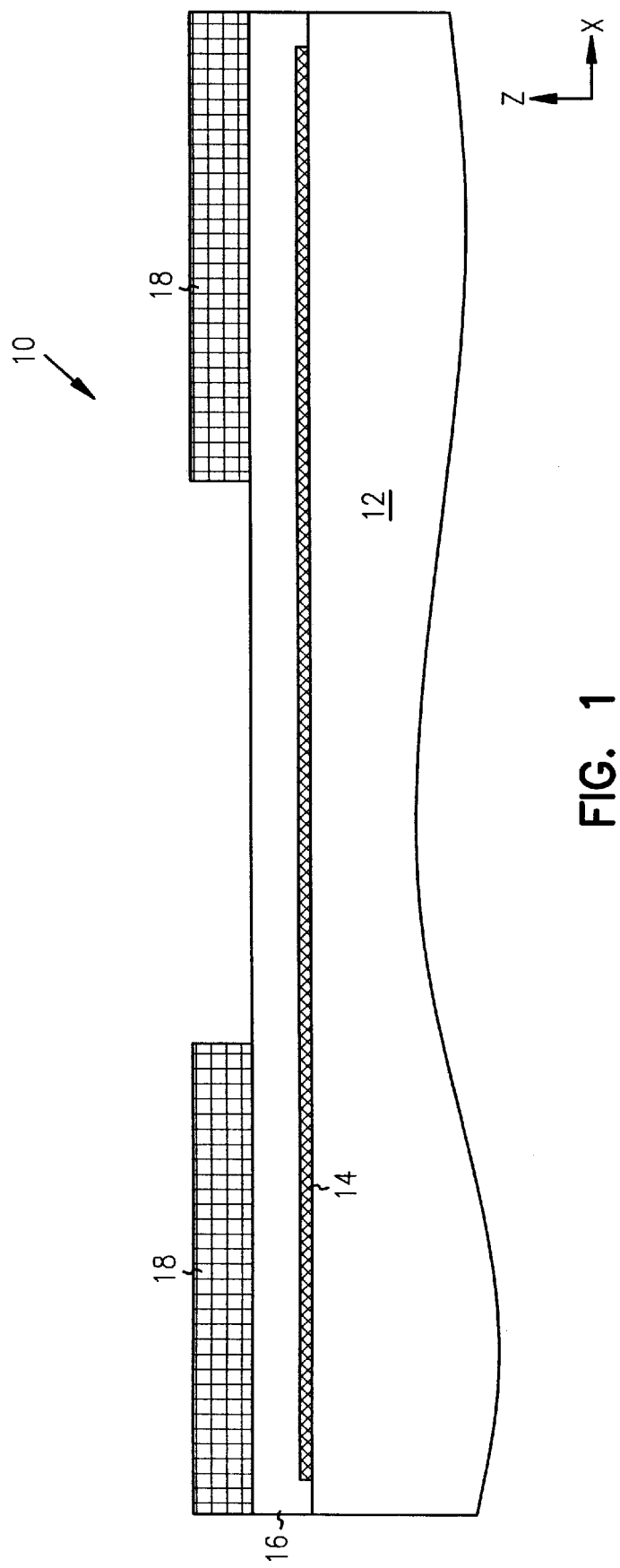
FIG. 1 is an elevational cut-away view of a memory device during fabrication.

FIG. 1 is an elevational cut-away view of a polymer memory device 10 during a process flow according to an embodiment. FIG. 1 illustrates a substrate 12 upon which the polymer memory device 10 may be formed. Typically, substrate 12 may be selected from microprocessor silicon, inorganic interlayer dielectric (ILD) material such as silicon oxide, organic ILD material such as polyimide, or others. A first electrode 14 is disposed upon substrate 12 and a first topology 16 is disposed over first electrode 14 and substrate 12. First electrode 14, although it may appear to be an integral electrical conductor, first electrode 14 may be a composite of a pin-out precursor and an electrode that forms part of a series of first electrodes. First topology 16 may be an ILD material such as silicon oxide and the like or polyimide and the like.

First electrode 14, as a pin-out precursor, may take on many pin-out technology forms, and the depiction herein as a pin-out precursor embodiment is illustrative and not limiting. Several pin-out technologies are known in the art that may be used as an embodiment of the present invention. The specific pin-out method used may depend upon the number of topologies that are formed, the specific application of the polymer memory device, specific performance issues such as switching speed, access speed, heat management, and other parameters.

Figure 2:
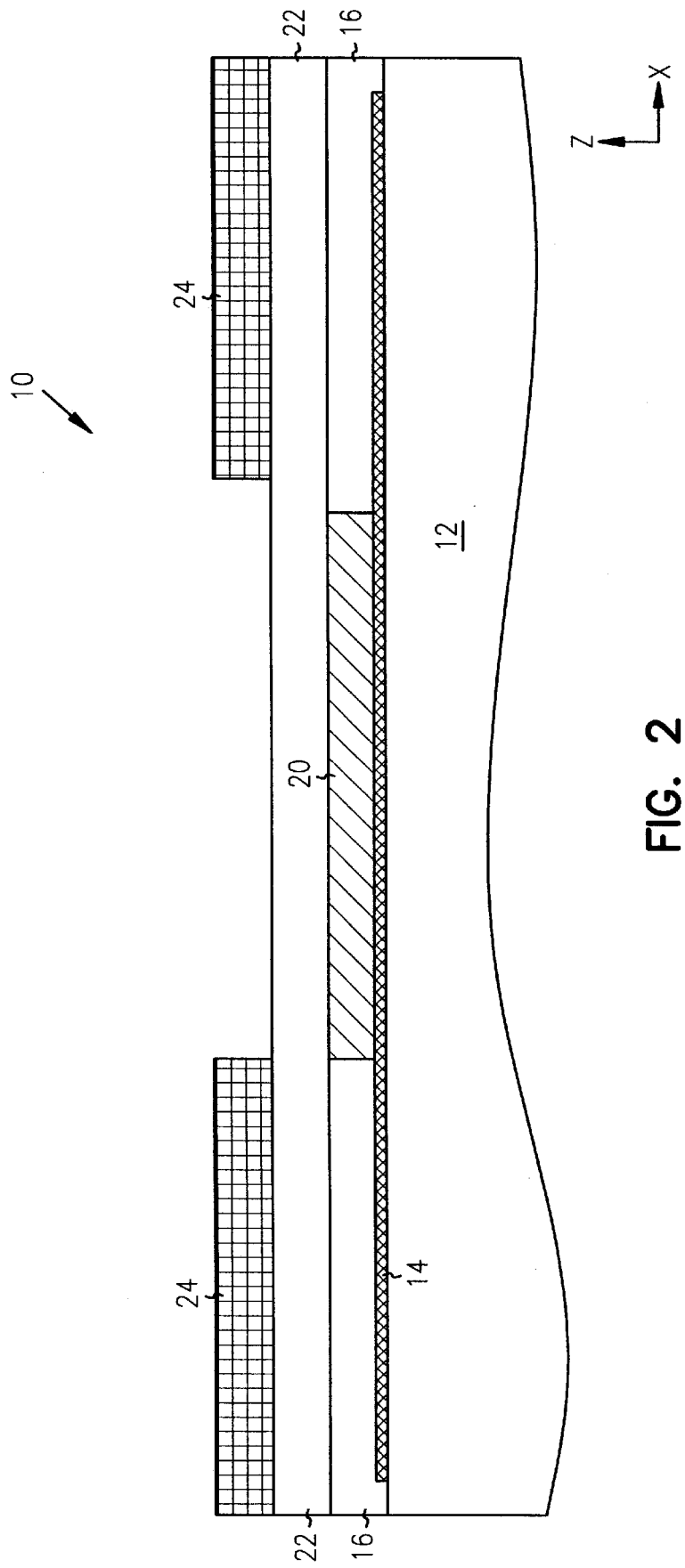
FIG. 2 is an elevational cut-away view of the memory device depicted in FIG. 1 after further processing.

First topology 16 is formed over first electrode 14 and then a mask 18 is patterned in order to expose a center region of first electrode 14. FIG. 2 illustrates further processing of polymer memory device 10 after center patterning of first topology 16 and filling the recess formed thereby with a first temporary fill material 20. After a process flow that may include chemical-mechanical polishing (CMP) of first temporary fill material 20, a subsequent topology, in this embodiment, second topology 22 is formed over first topology 16 and first temporary fill material 20. Second topology 22 is likewise patterned with a mask 24 that will be used to form a center pattern that communicates to first topology 16.

Figure 3:
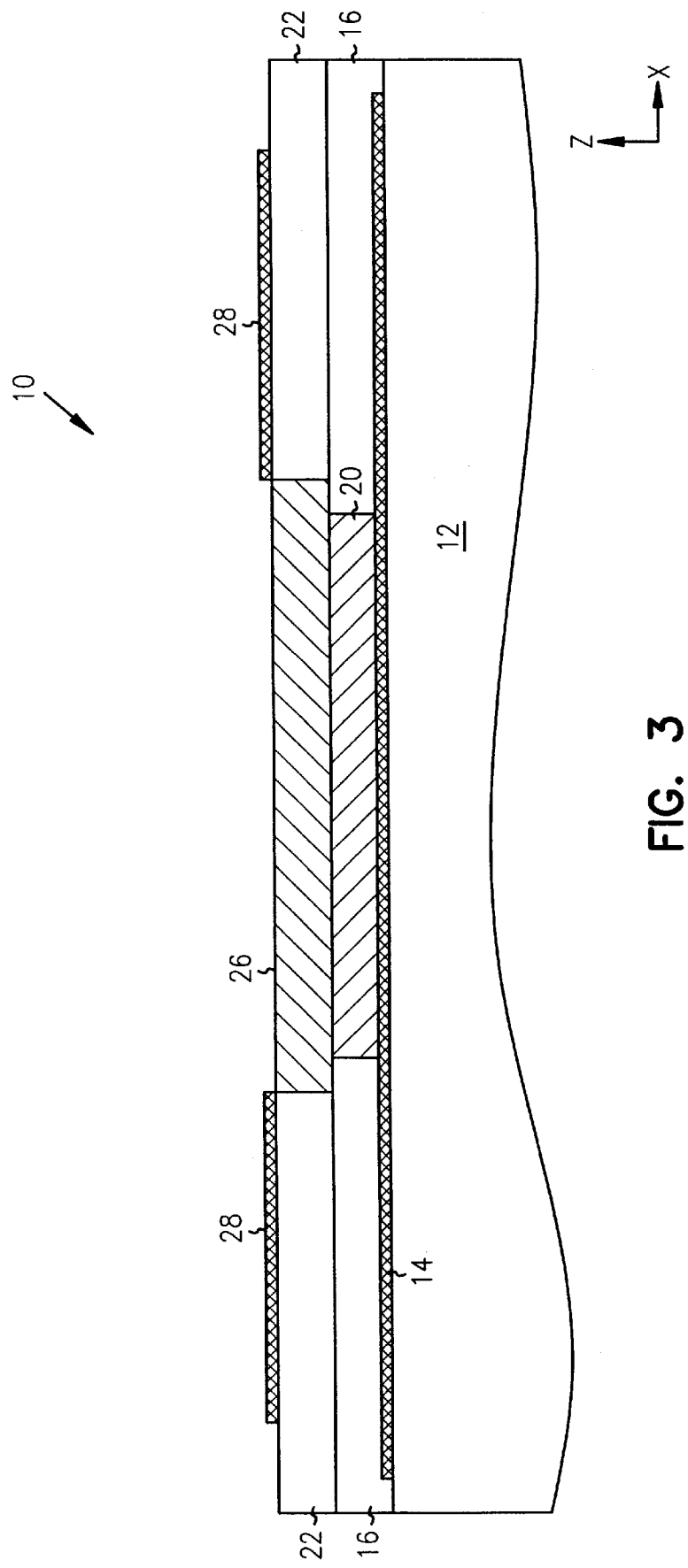
FIG. 3 is an elevational cut-away view of the memory device depicted in FIG. 2 after further processing.

FIG. 3 illustrates further processing in which a recess is etched through mask 24, and it is filled with a subsequent temporary fill material, in this embodiment a second temporary fill material 26. Above second topology 22 and second temporary fill material 26, a subsequent pin-out precursor, in this embodiment a third pin-out precursor 28 is formed. A subsequent second pin-out precursor is formed between first topology 16 and second topology 22, and it is viewable in FIG. 8.

Figure 4:
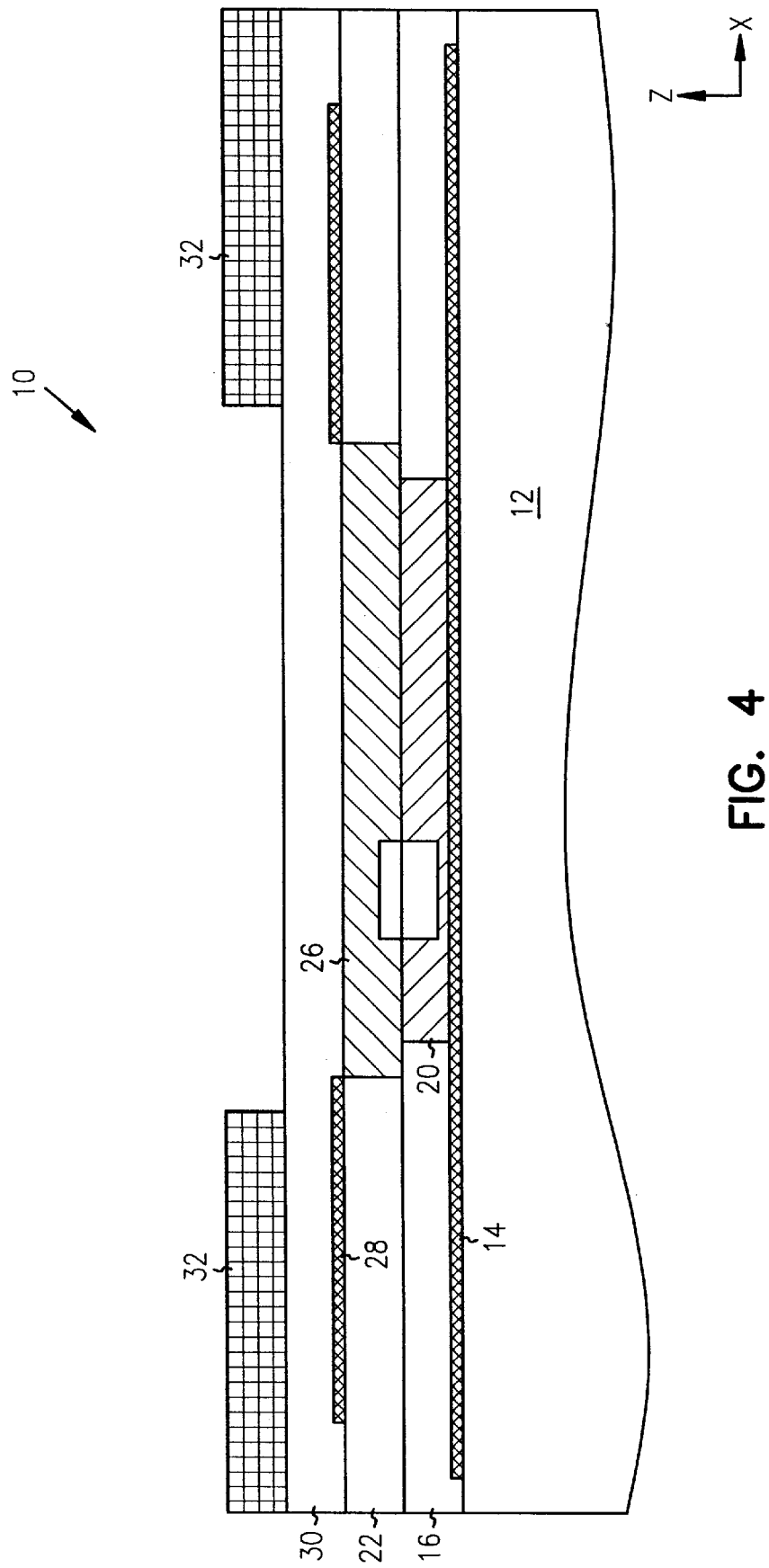
FIG. 4 is an elevational cut-away view of memory device in FIG. 3 after further processing.
Figure 5:
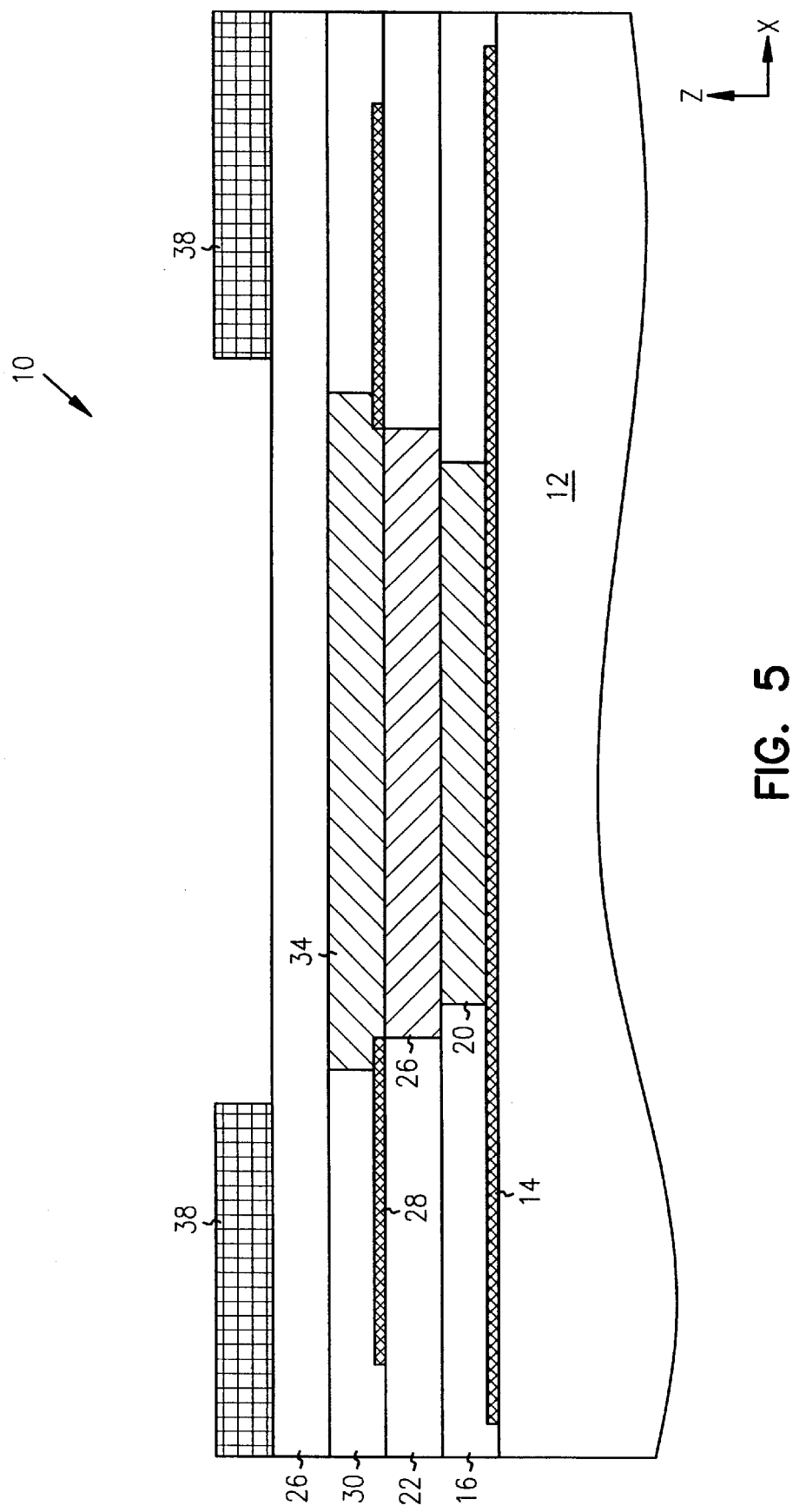
FIG. 5 is an elevational cut-away view of the memory device depicted in FIG. 4 after further processing.

FIG. 4 illustrates further processing of polymer memory device 10. After the formation of third pin-out precursor 28, a subsequent topology, in this case a third topology 30 is formed as depicted. A mask 32 is patterned in preparation to etch a recess that communicates to second temporary fill material 26. As depicted in FIG. 5, a recess has been formed and filled with a third temporary fill material 34. CMP may be used each time a temporary fill material has been formed. FIG. 5 also depicts a stepped structure with a filled cavity that is filled with first temporary fill material 20, second temporary fill material 26, and third temporary fill material 34. Further etching of polymer memory device 10 is carried out in a subsequent topology, in this case a fourth topology 36 by etching through a mask 38. As set forth herein, a subsequent pin-out precursor, in this case a fourth pin-out precursor, illustrated in FIG. 8 is formed between third topology 30 and fourth topology 36.

Figure 6:
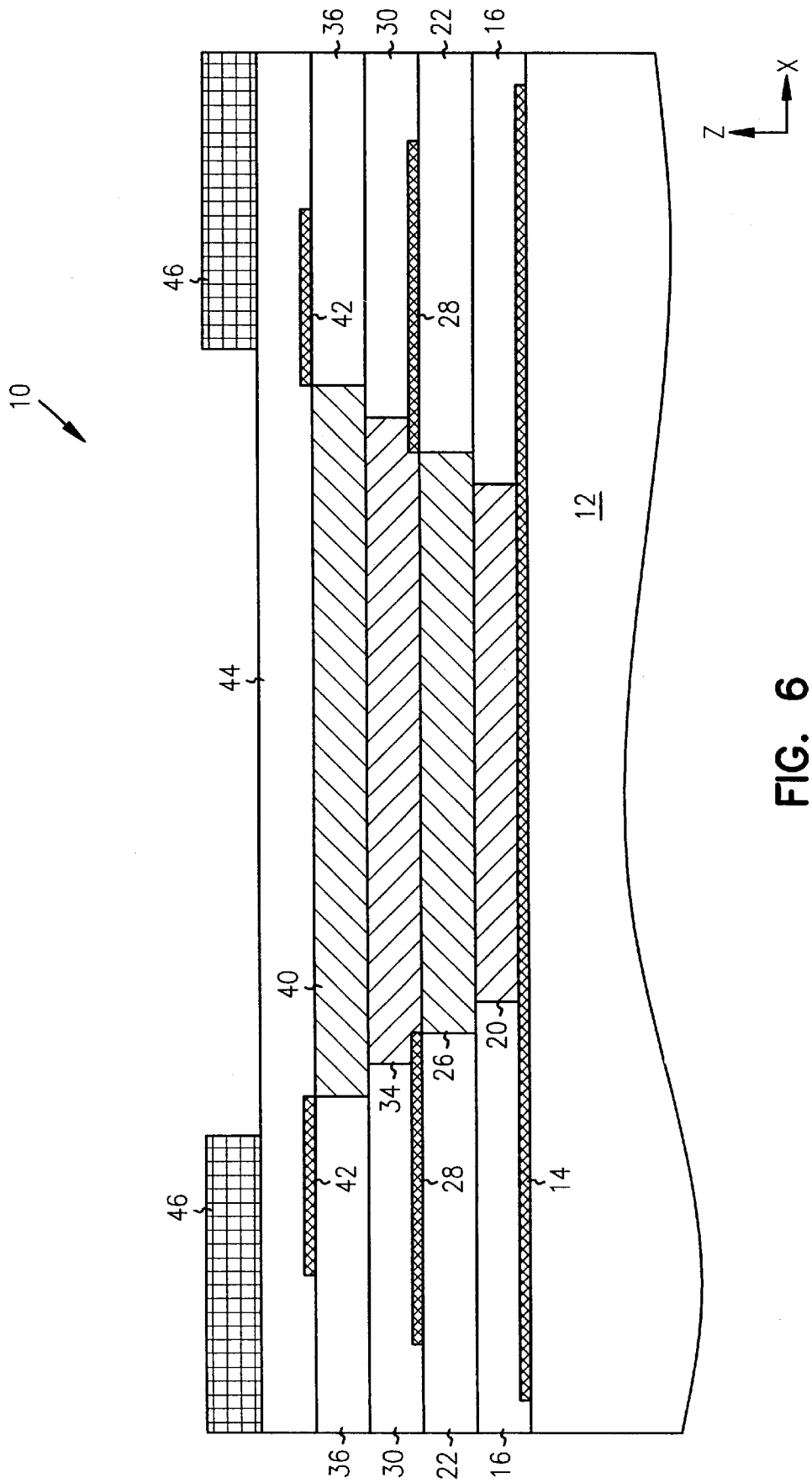
FIG. 6 is an elevational cut-away view of the memory device depicted in FIG. 5 after further processing.

FIG. 6 illustrates further processing of polymer memory device 10 depicted in FIG. 5. A fourth temporary fill material 40 is formed in the recess that was etched through mask 38, depicted in FIG. 5. A fifth pin-out precursor 42 is formed over fourth topology 36 and a fifth topology 44 is formed over fifth pin-out precursor 42, fourth topology 36, and fourth temporary fill material 40. Similar to the process flow depicted in FIG. 5, a mask 46 is patterned in preparation to form another subsequent topology for polymer memory device 10.

Figure 7:
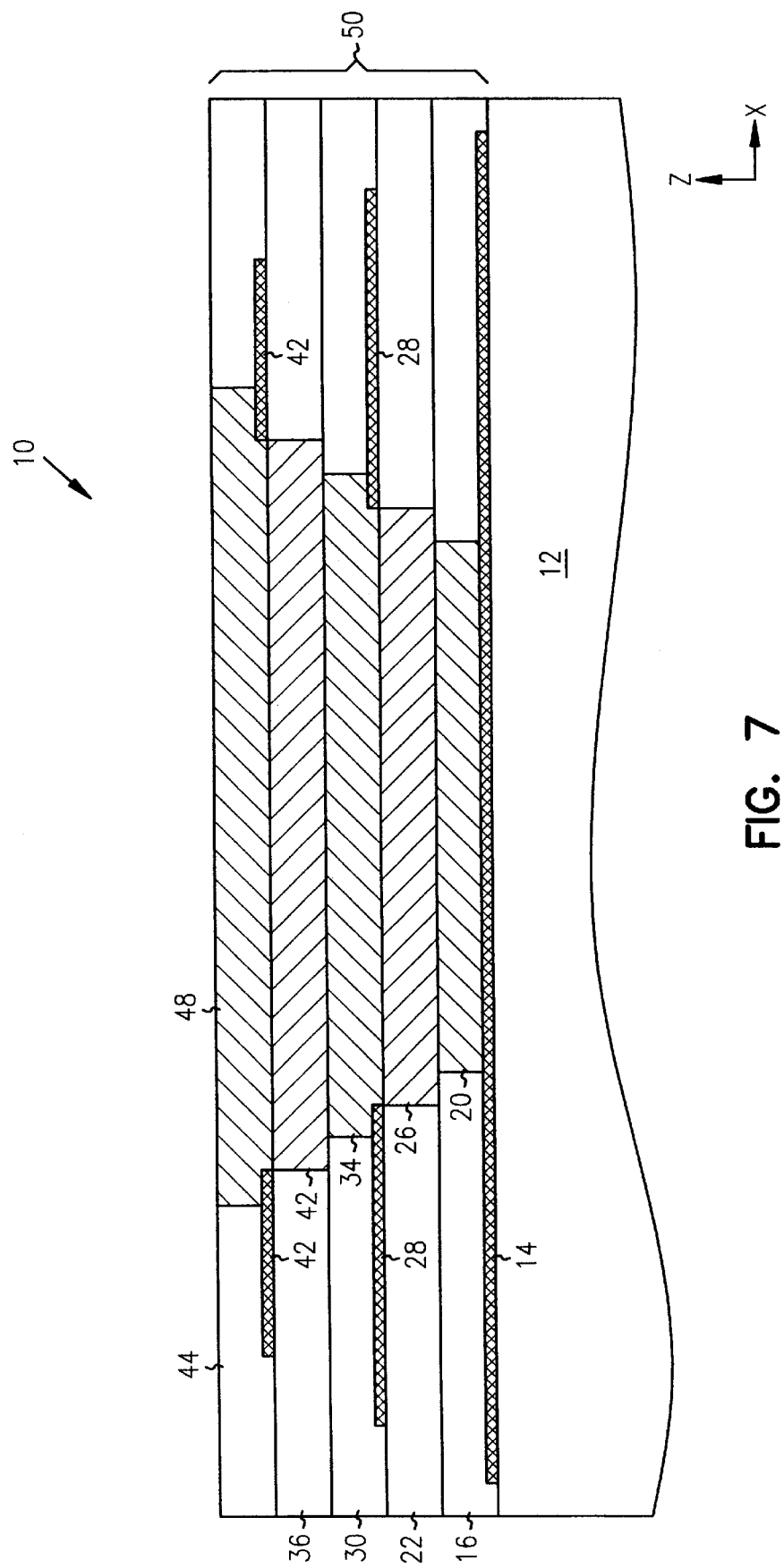
FIG. 7 is an elevational cut-away view of the memory device depicted in FIG. 6 after further processing.

FIG. 7 illustrates the result of etching a recess and filling it with a fifth temporary fill material 48. At this stage of this process flow embodiment, a five-level topology 50 has been formed with five pin-out precursors, three of which are illustrated in FIG. 7. FIG. 8 depicts further processing and exposes polymer memory device 10 in a cross-sectional Y-Z orientation in comparison to the cut-away X-Z orientations of FIGS. 1–7. The second pin-out precursor 52, and the fourth pin-out precursor 54 are now visible in FIG. 8. A sixth pin-out precursor 56 is formed and then an etch is carried out to remove all temporary fill materials depicted in FIG. 7. Accordingly, a stepped structure is formed that has a cavity 58 that exposes first electrode 14 and all pin-out precursors.

Figure 8:
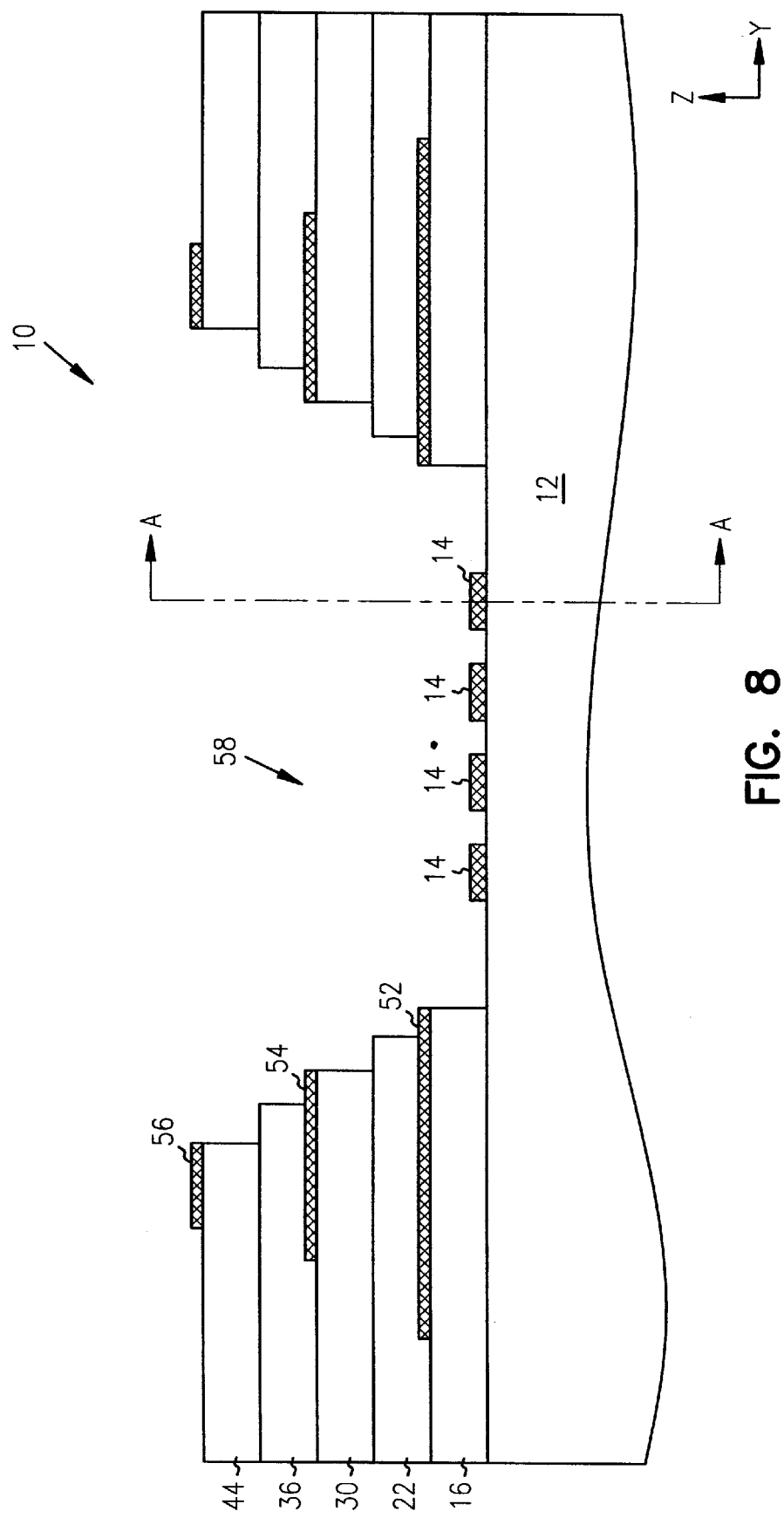
FIG. 8 is an elevational cross-section view of the memory device after rotating the device depicted in FIG. 7 to expose it in the Z-Y plane.

As depicted in FIG. 8, FIG. 7 may be viewed along the line A–A' as a cut-away illustration. Further, first electrode 14 is depicted as having four electrodes in a series. Because first electrode 14 will act as a row or column in the inventive polymer memory device 10, the number of electrodes may be numerous according to known row-and-column data storage layouts.

As set forth herein, first electrode 14 may be part of a series of first electrodes, and it may double as a first pin-out precursor 14. As set forth herein, the pin-out precursor scheme depicted in FIGS. 7 and 8 is a non-limiting example that is used for illustrative purposes. Other pin-out precursor schemes are known in the art. For example, row and column addressing may be accomplished with contacts that communicate to a plurality of rows or columns. In any event, the first-through-fifth pin-out precursors are exposed by removal of the temporary fill materials and the formation of the stepped structure and cavity 58. Further, sixth pin-out precursor 56 is also exposed.

Figure 9:
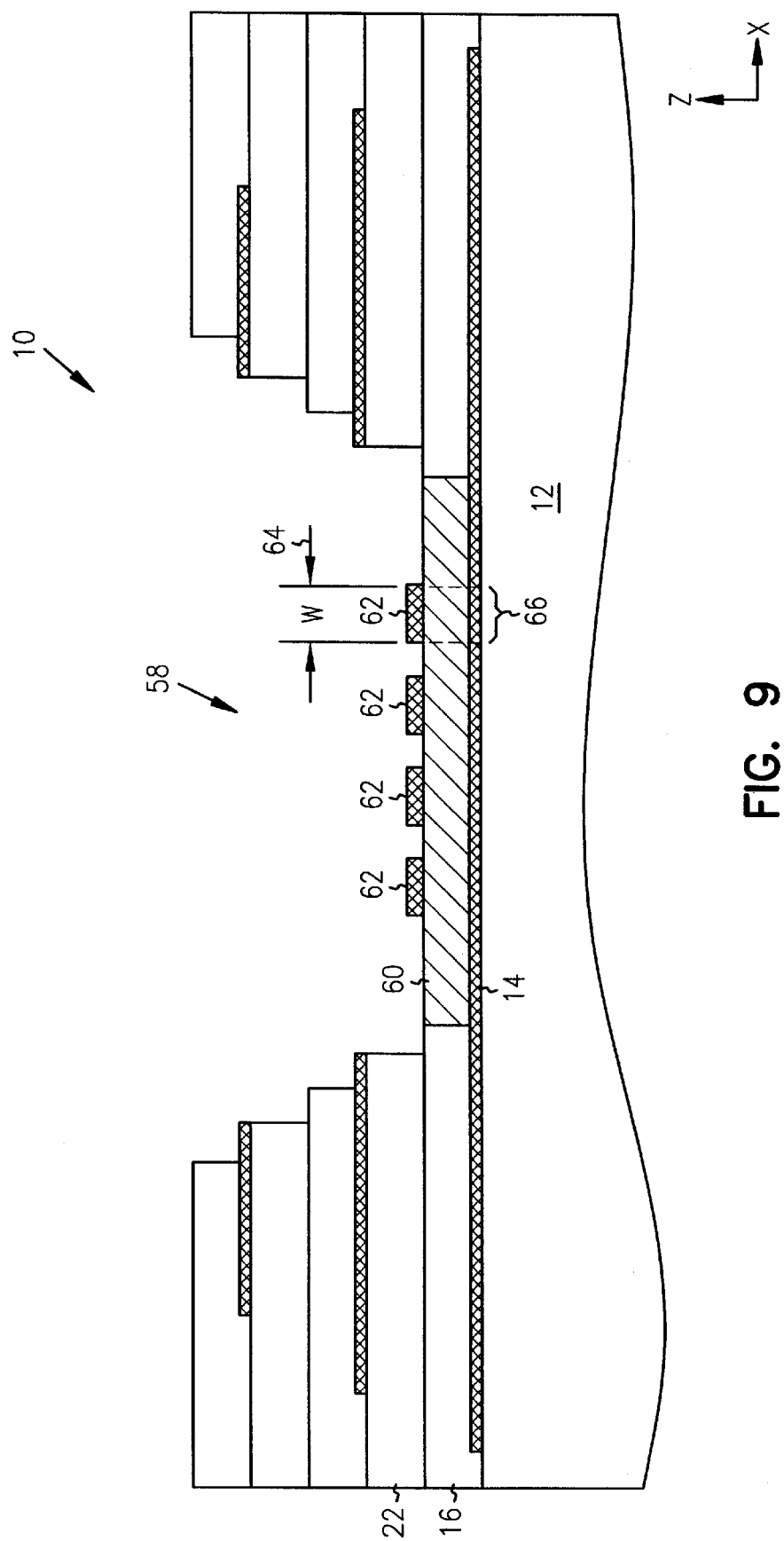
FIG. 9 is an elevational cut-away view of the memory device depicted in FIG. 7 after further processing that illustrates formation of a first memory structure.

After the removal of all temporary fill materials and the exposure of all pin-out precursors, the process flow may be directed toward forming multiple layers of ferroelectric polymers. FIG. 9 illustrates further processing in which a first ferroelectric polymer (FEP) layer 60 is formed over first electrode 14. FIG. 9 is rotated back to the X-Z plane similar to FIGS. 1–7. After the formation of first FEP layer 60, a series of subsequent electrodes, in this case second electrodes 62 is formed. Accordingly, a first polymer memory structure 64 is formed at about a coplanar orientation with first topology 16. First polymer memory structure 64 may include first electrode 14, first FEP layer 60, and second electrode 62.

FIG. 9 also illustrates the achievement of a configuration that may be referred to as a "cross point" 66. In other words, the cross point 66 or projection of the width W, of second electrode 62 downward onto first electrode 14 exposes an area of first FEP layer 60 that is about equivalent to the square of width W if first electrode 14 also has a width of about width W. The amount of first FEP layer 60 that is within this projected area may be most susceptible of being written to and read from as a memory element embodiment.

The cross point 66 of polymer memory device 10 may have a dimension in the X-direction that may be tied to a particular minimum-feature mask technology. For example, photolithography process flows may have minimum features that are 0.25 micrometers (microns), 0.18 microns, and 0.13 microns. It is understood that the various metrics such as 0.25 microns may have distinctly different dimensions in one business entity from a comparative business entity. Accordingly, such metrics, although quantitatively called out, may differ between a given two business entities. Other minimum features that may be accomplished in the future are applicable to the present invention.

Figure 10:
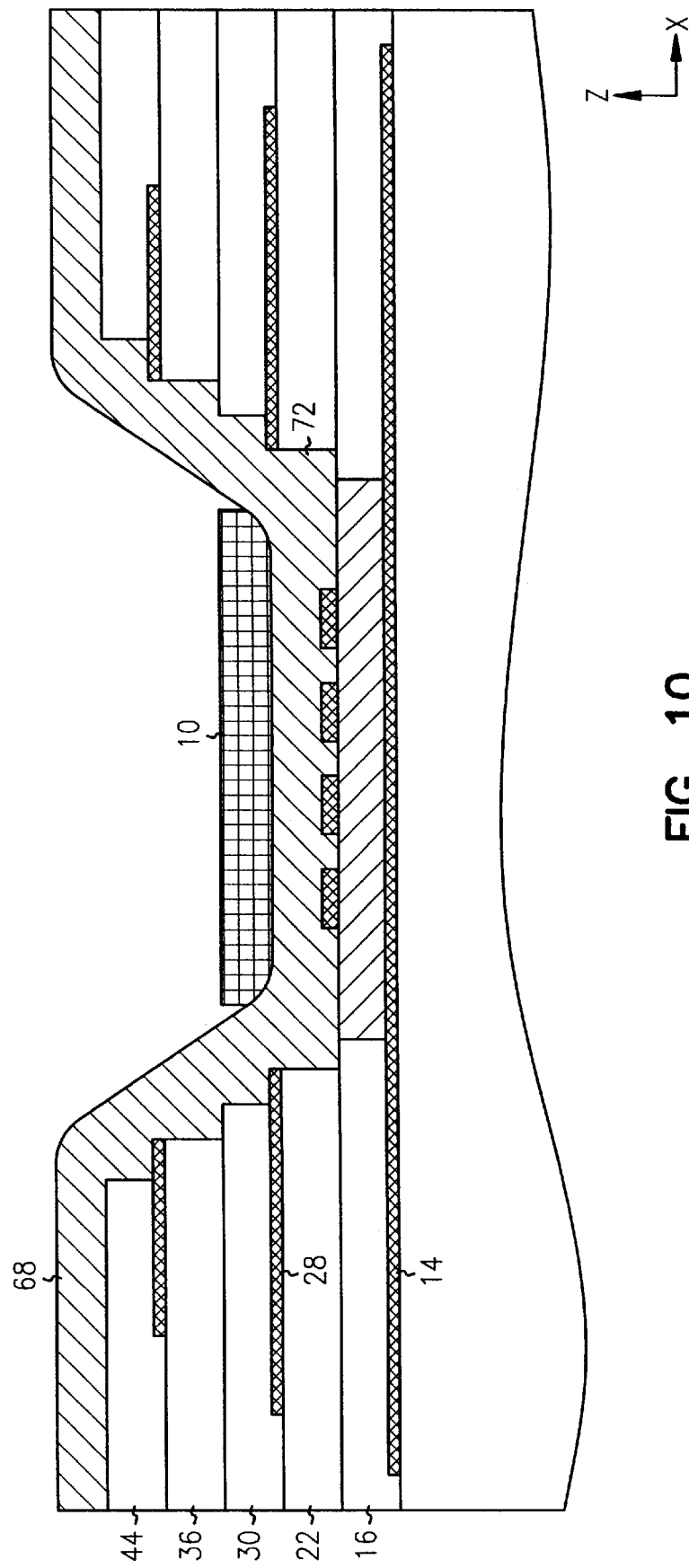
FIG. 10 is an elevational cut-away view of the memory device depicted and FIG. 9 after center-masking of ferroelectric polymer material.

FIG. 10 illustrates continued processing. Typically, FEP material is formed over substrate 12 and structures supported thereon by spin-on processing. Other processes may be carried out to form FEP layers, including chemical vapor deposition (CVD), substrate dip deposition, Langmuir-Blodgett deposition, and spray-on deposition according to known technique.

In one embodiment, FEP material is spun-on by depositing the FEP material as a fluid in a puddle prime over substrate 12 for a period of from about 5 to 25 seconds and spinning substrate 12 and in a rotational range from about 300 rpm to about 6000 rpm and for a time range from about 5 seconds to about 20 seconds. FEP material processing conditions to form FEP layers is illustrated in FIG. 10. FIG. 10 depicts a spin-on FEP layer 68 and a center masking 70 thereof in preparation for an etch process to remove peripheral FEP material beyond the vertical edges 72 of second topology 22. This process is achieved by forming a center mask 70 that may be aligned with vertical edges of second topology 22. In other words, FEP material is removed near and at second topology 22.

Thereafter, an etch is carried out using oxygen plasma according to known technique at about 23° C. and about one atmosphere. Effectively, all peripheral FEP material is removed, and third pin-out precursor 28 is exposed at or near third topology 30 in preparation to make connection with a series of electrodes at this topology.

Figure 11:
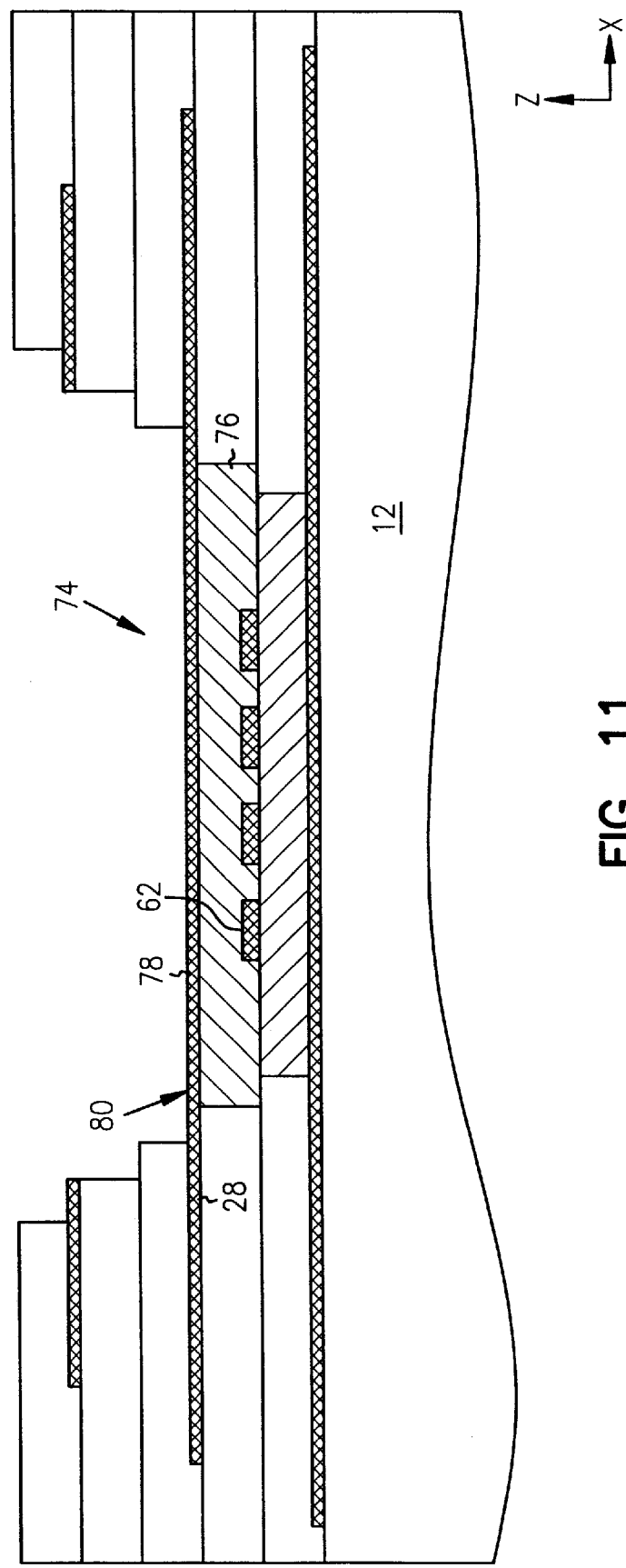
FIG. 11 is an elevational cut-away view of the memory device depicted in FIG. 10 after further processing.

FIG. 11 depicts further processing to form a second polymer memory structure 74. After the oxygen plasma etch of spin-on FEP layer 68 (FIG. 10) that leaves a second FEP layer 76, a third electrode 78 is patterned that makes electrical connection with third pin-out precursor 28 at a juncture 80 therebetween. As such, second polymer memory structure 74 may include second electrode 62, second FEP layer 76, and third electrode 78.

Figure 12:
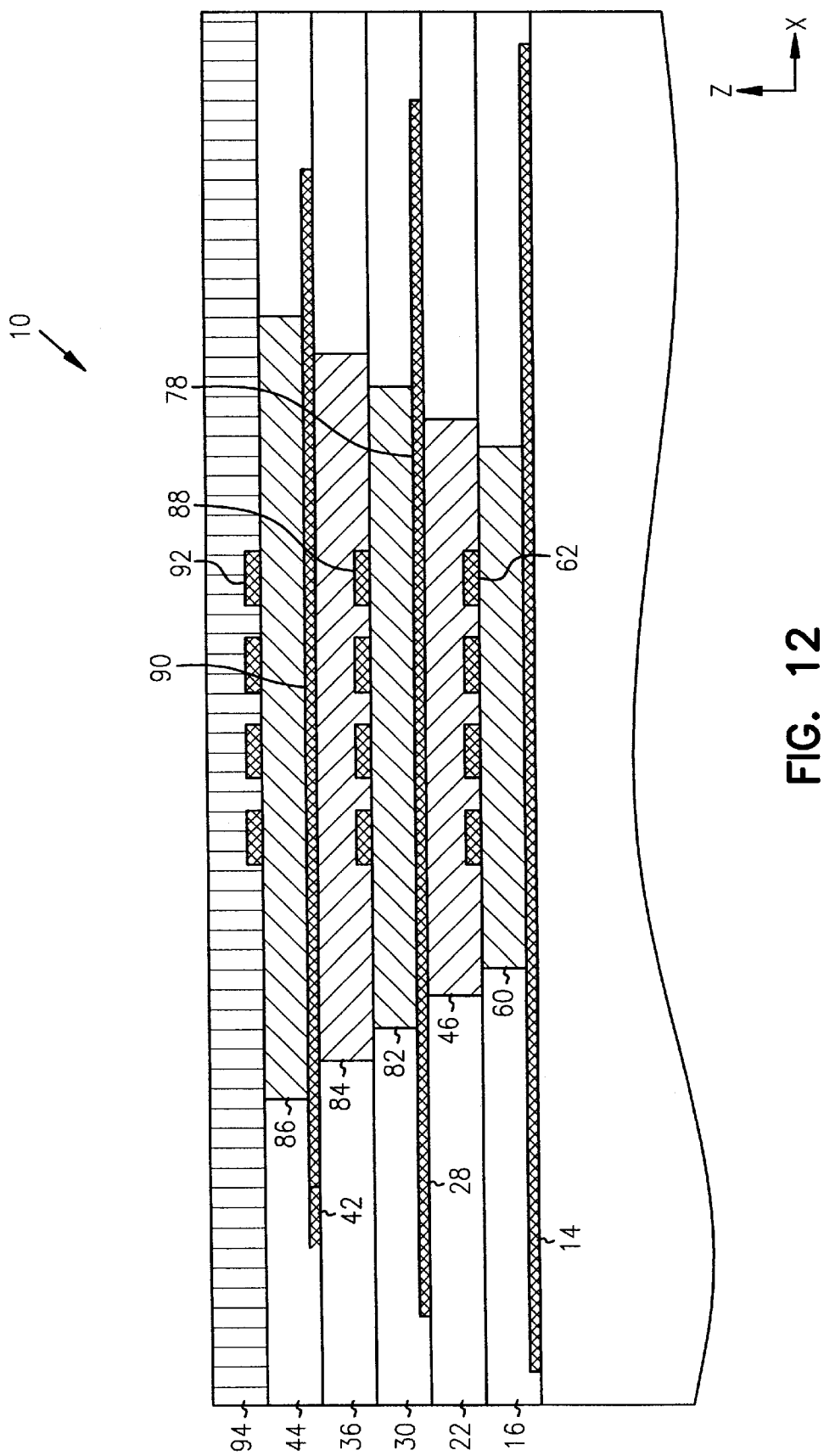
FIG. 12 is an elevational cut-away view of the memory device depicted in FIG. 11 after further processing.

It may now be clear to one of ordinary skill in the art that a multi-rank polymer memory device may be formed according to embodiments depicted in this disclosure. In one embodiment, a five-rank polymer memory device 10 is formed as is illustrated in FIG. 12 during further processing. Accordingly, after the fabrication of a third FEP layer 82, a fourth FEP layer 84, and a fifth FEP layer 86, along with a fourth electrode 88, a fifth electrode 90, and a sixth electrode 92, a protective layer 94 is formed over substrate 10. Protective layer 94 may be a passivation ILD material such as a polyimide material as is known in the art, or it may be an SiON film made by plasma-enhanced CVD (PECVD) at a low deposition temperature. Blanket formation of protective layer 94 may be done such as by spin-on processing of a polyimide material as is known in the art. In another embodiment, an inorganic material may be deposited, subject only to avoiding temperature elevation that will compromise the quality of the FEP layers. For example atomic layer CVD (ALCVD) may be carried out according to known technique to form protective layer 94.

Figure 13:
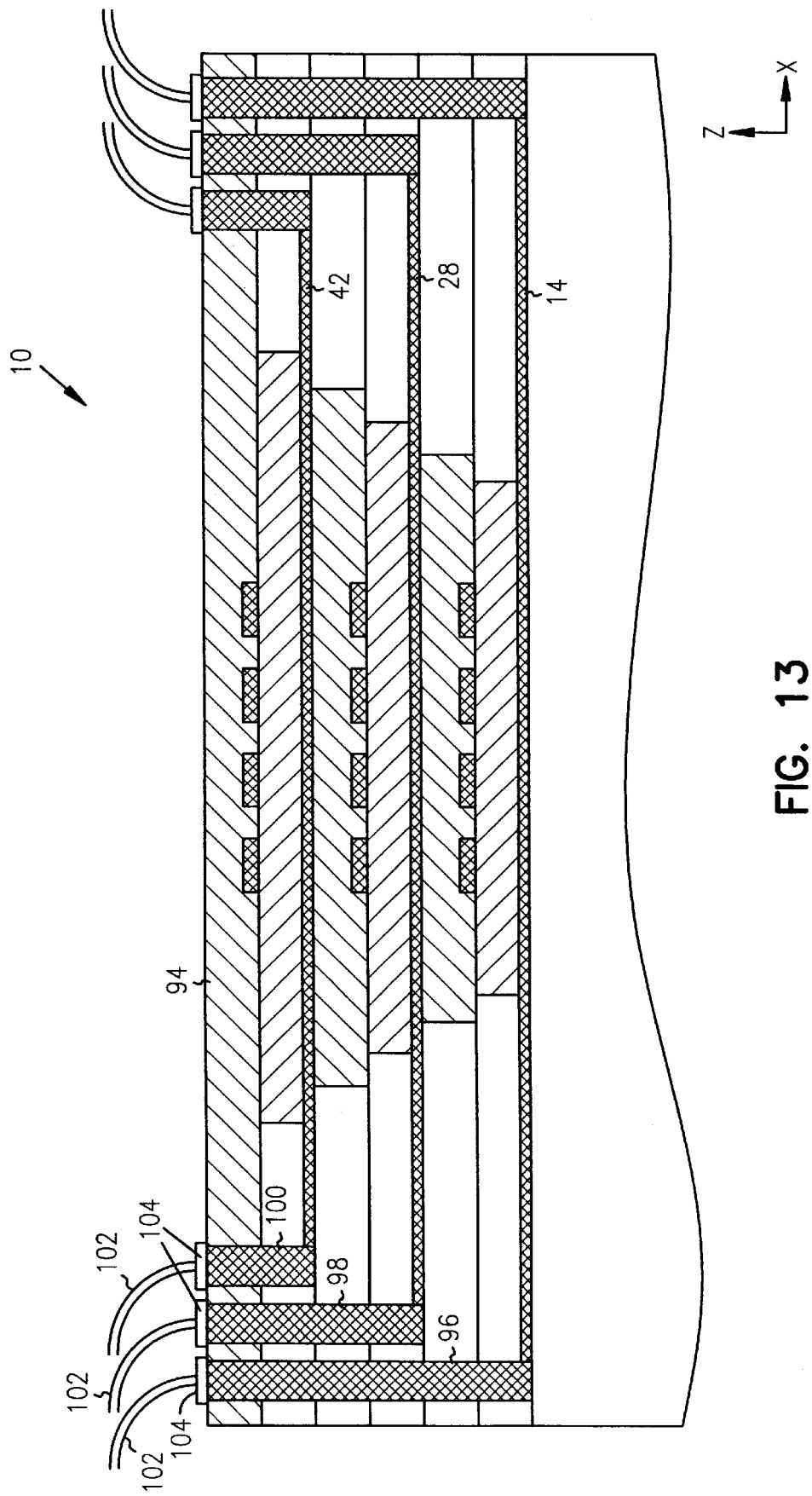
FIG. 13 is an elevational cut-away view of the memory device depicted in FIG. 12 after further processing.

Following the selection of the preferred number of polymer memory ranks, electrical contact may be done by forming contacts in polymer memory device 10 by various pin-out methods. FIG. 13 illustrates one electrical contact embodiment in which bond wires may be used. A first contact 96, a third contact 98, and a fifth contact 100 are depicted as making electrical connection with first pin-out precursor 14, third pin-out precursor 28, and fifth pin-out precursor 42, respectively. A second, fourth, and sixth contact (not illustrated) may also be formed to connect their respective electrodes through the respective pin-out precursors. Those contact vias can be formed using conventional multi-level interconnect fabrication methods that are used in very large scale integration (VLSI) chip processing. One embodiment in via engineering relates to form vias in a pre-patterned silicon substrate before formation of the FEP layers Although the contacts do not appear in previous figures, it may be preferable to form them before the first FEP layer 60 is formed, such as a process flow at or near the process depicted after FIG. 7. Accordingly, the contacts may be formed by CVD or by physical vapor deposition (PVD) of a metal or metal alloy as is preferred in the art. Where substrate 12 is an inorganic such as silicon or silicon oxide, pressure filling may be accomplished. It is understood that the figures are not necessarily drawn to scale and that the aspect ratios of the contacts illustrated may not be greater than current known technique.

FIG. 13 also illustrates bond wires 102 that are connected to the contacts through bonding pads 104. Other technologies may be used to make electrical connection of polymer memory device 10 such as solder bump or ball technology applied a in flip-chip configuration.

Figure 14:
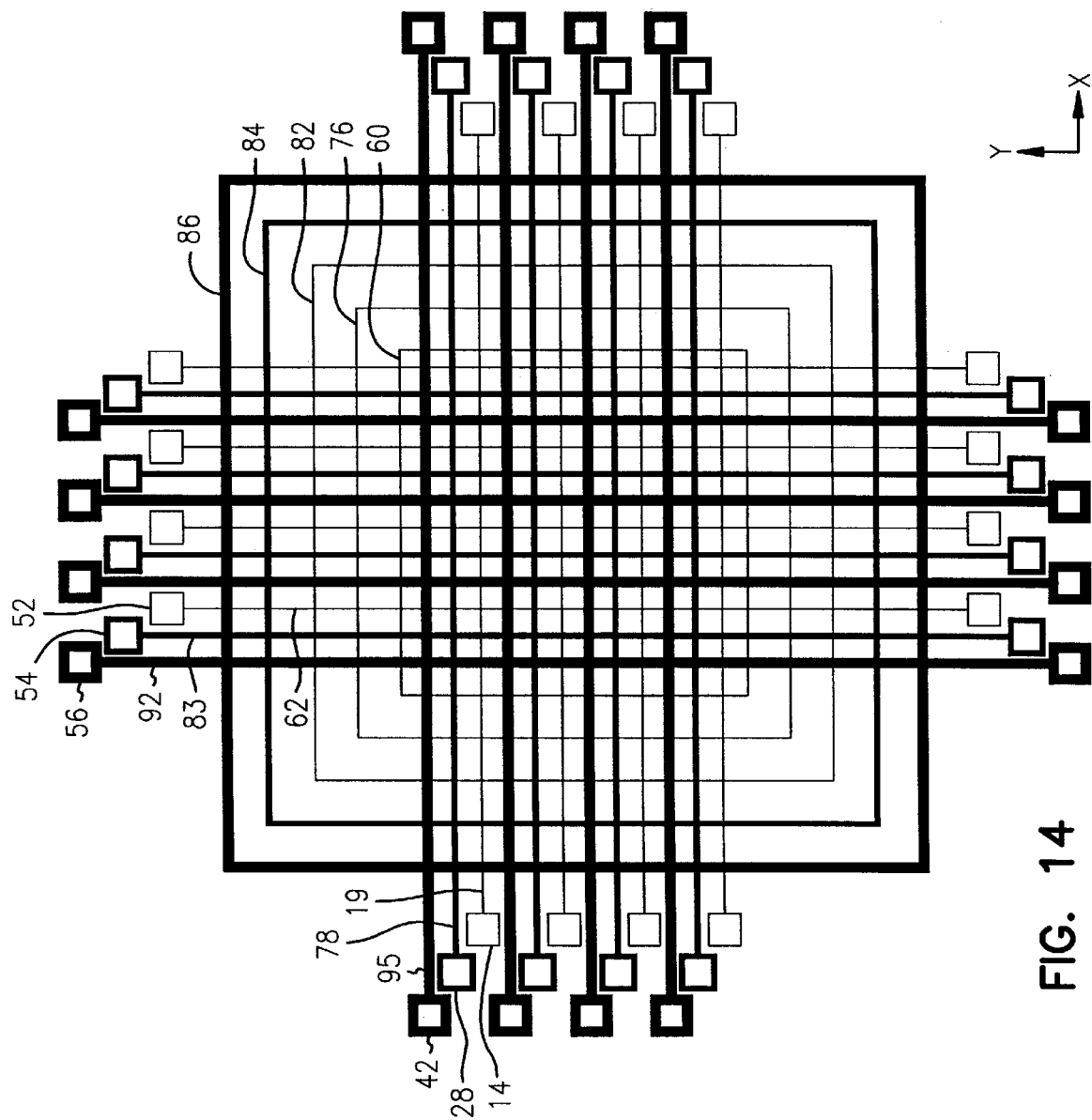
FIG. 14 is a top plan schematic view of the electrodes and the ferroelectric polymer memory layers as they are configured in a series of electrodes and five ranks of memory structures.

FIG. 14 illustrates a top schematic view of FEP layers, electrodes, and pin-out precursors. Each FEP layer, although not depicted in the Z-direction in FIG. 14, may be referred to in connection with electrodes in FIG. 12. First electrode 14 is disposed upon substrate 12 (not pictured). It is noted that first electrode 14 and first pin-out precursor 14 have the same reference numeral as they may be an integral structure. Second electrode 62 is disposed above first FEP layer 60 and below second FEP layer 76. Third electrode 78 is disposed above second FEP layer 76 and below third FEP layer 82. Fourth electrode 88 is disposed above third FEP layer 82 and below fourth FEP layer 84. Fifth electrode 90 is disposed above fourth FEP layer 84 and below fifth FEP layer 86. Finally, sixth electrode 92 is disposed above fifth FEP layer 86. First-through-sixth pin-out precursors, 14, 52, 28, 54, 42, and 56, respectively, are depicted with optional enlarged termini for both contact landing pad and etch stop purposes.

Various polymers may be used to form the FEP layers. In one embodiment, the FEP layers are made from a ferroelectric polymer selected from polyvinyl and polyethylene fluorides, copolymers thereof, and combinations thereof. In another embodiment, the FEP layers are made from a ferroelectric polymer selected from polyvinyl and polyethylene chlorides, copolymers thereof, and combinations thereof. In another embodiment, the FEP layers are made from a ferroelectric polymer selected from polyacrylonitriles, copolymers thereof, and combinations thereof. In another embodiment, the FEP layers are made from a ferroelectric polymer selected from polyamides, copolymers thereof, and combinations thereof. Other embodiments may include combinations of the above that cross different types such as polyfluorides and polyamides or polyfluorides and polyacrylonitriles.

In one embodiment, the FEP layers are made from a ferroelectric polymer selected from $(CH_2-CF_2)_n$, (CHF—

$CF_2)_n$, $(CF_2-CF_2)_n$, α-, β-, γ-, and δ-phases thereof, preferably the β-phase, $(CH_2-CF_2)_n-(CHF-CF_2)_m$ copolymer, α-, β-, γ-, and δ-phases, preferably the β-phase of $(CH_2-CF_2)_n-(CHF-CF_2)_m$ copolymer, and combinations thereof. The copolymer of $(CH_2-CF_2)_n-(CHF-CF_2)_m$ may be referred to as P(VDF-TrFE) or poly vinylidene fluoride-triflouroethylene. In one particular embodiment, the FEP layers are made from a ferroelectric polymer selected from a β-phase copolymer of $(CH_2-CF_2)_n-(CHF-CF_2)_m$ wherein n and m equal 1, and wherein n is in a fraction range from about 0.6 to about 0.9, preferably from about 0.7 to about 0.8, and more preferably about 0.75.

A preferred vertical thickness of an FEP layer may be in a range from about 500 Å to about 2,000 Å or larger, subject only to the design rules of a specific application. Other thicknesses for the FEP layers may be in a range from about 750 Å to about 1,500 Å. In one embodiment, the FEP layers may be about 1,000 Å.

Most polymer systems will exhibit some degree of atacticity. Where an FEP copolymer is formed by the spin-on technique, the film will tend more away from isotacticity than for a monomer under similar deposition conditions. In one embodiment, the ordered amount of crystallinity (degree of isotacticity) in an FEP layer is in a range from about one-third to about two-thirds, preferably greater that about one-half. The ordered amount of the crystalline structure may be quantified by diagnostic techniques such as scanning electron microscopy, x-ray diffraction, and others. Greater isotacticity may be achievable by other deposition techniques such as Langmuir-Blodgett deposition as is known in the art.

The following is an example of a method of making an embodiment of the present invention. The process technology relates to 0.25 micron processing. Reference may be made to FIGS. 1–14. To fabricate a polymer memory device 10, a substrate 12 is provided, comprising logic-bearing silicon for an inventive multiple-rank, cross-point polymer memory device. Substrate 12 may include an ILD material such as silicon oxide or an organic ILD material such as a polyimide or an FR board. The ILD thickness may be in a range from about 1,000 Å to about 5,000 Å. Over substrate 12, a first electrode 14 is formed and patterned by CVD and etch, respectively, of aluminum or copper. A first topology 16 is formed by CVD of silicon oxide by the decomposition of tetraethyl ortho silicate (TEOS) or another process known in the art. A mask 18 is center-hole patterned and first topology is etched by use of an etch recipe that is selective to first electrode 14 and substrate 12. Thereafter, a first temporary fill material 20 is formed by CVD of a silicon oxide material that is chemically distinguishable from first topology 16.

The process flow continues by forming second pin-out precursor 52 under conditions similar to the formation of first electrode 14. Thereafter, second-through-fifth topologies with their respective pin-out precursors and temporary fill materials are formed as set forth herein.

After the formation of fifth topology 44, contact holes are made that communicate to the various pin-out precursors. Etching is carried out under conditions that are etch-recipe selective to the pin-out precursors. In this example, five anisotropic dry etches through silicon oxide are carried out. Effectively, the pin-out precursors may act as etch stops for the contact hole etching. However, where the pin-out precursors have a significantly larger contact area such as depicted at their termini in FIG. 14, a single anisotropic dry etch may be carried out that achieves five various depths because of the effectiveness of each pin-out precursor as an etch stop.

After the formation of contacts, a wet etch is carried out to remove all temporary fill materials. The wet etch is selective to the topology and pin-out precursor materials. Thereafter, FEP material is spun on under conditions set forth herein, a center mask is patterned, and the FEP layer is etched.

The FEP material has a thickness of about 1,000 Å. The FEP material comprises a copolymer of $(CH_2-CF_2)_n-(CHF-CF_2)_m$ wherein n and m equal 1, and wherein n is about 0.75.

An oxygen plasma etch is next carried out at ambient temperature and pressure according to known technique. The center mask protects what has become first FEP layer 60. A second electrode 62 is formed over first FEP layer 60 by ALCVD of copper or aluminum as set forth herein. Second electrode 62 is configured in a cross-point layout to first electrode 14. Second electrode 62 is also patterned to make electrical contact with second pin-out precursor 52. The presence of first electrode 14, first FEP layer 60, and second electrode 62 may be referred to as a first polymer memory structure 64. The successive formation of second-through-fifth polymer memory structures may be carried out under conditions similar to the formation of the first polymer memory structure.

After the formation of the polymer memory structures, a protective layer 94 is formed by spin-on processing of a polyimide material according to known technique. Bond pads 104 are formed by PVD of a metal such as gold, aluminum, and the like, and polymer memory device 10 is seated on a host (not pictured). Thereafter, bond wires 102 make electrical connection between polymer memory device 10 and the host. In this embodiment, the host is a board that holds at least a portion of a chip set for a polymer memory function.

According to this example, the polymer memory device operates in a range below about 9 V, and preferably in a range from about 0.5 V to about 5 V. This voltage may relate to both the destructive read method and the write method according to an embodiment.

Figure 15:
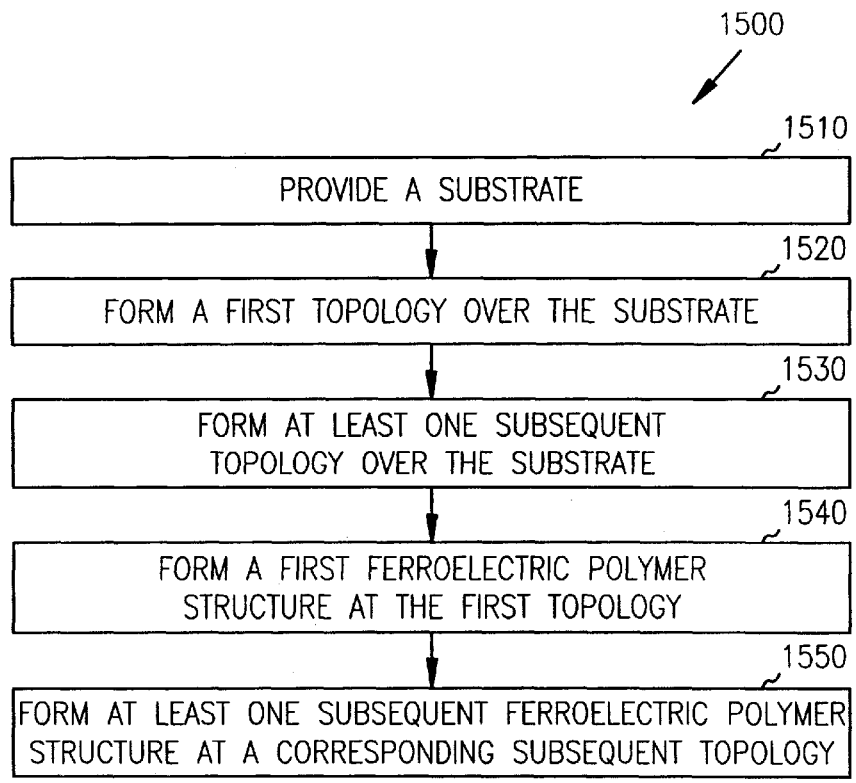
FIG. 15 is a process flow diagram according to an embodiment.

FIG. 15 illustrates a process flow embodiment that describes fabrication of a memory device that comprises at least two ranks of FEP structures. First, the process 1500 begins by providing 1510 a substrate. Thereafter, a first topology is formed 1520 over the substrate. Next, the process flow continues by forming 1530 at least one subsequent topology over the first topology. Thereafter, the process flow continues by forming a first FEP memory structure at the first topology. Upon the substrate, the inventive embodiment(s) may be arranged with contact of first and second electrodes at the respective first and second pin-out precursors. Next, at least one subsequent FEP memory structure is formed 1550 over the previous FEP structure(s). It is understood that a subsequent FEP memory structure may share the top electrodes from the previous FEP memory structure. Other processing is carried out such as forming a protective layer over the electrodes as set forth herein.

The inventive process may be described algorithmically. For example, a 5-rank polymer memory device will have n=5 ranks. After forming the first topology, the process continues by forming n–1 subsequent topologies over the substrate. Formation of the FEP structures includes spinning on a first ferroelectric polymer material over the substrate and at the first topology. Thereafter, the process flow continues by removing ferroelectric polymer material near and at the first topology. Where n is equal to five, a second variable, x, proceeds to sequentially increase from a value of 2 to the value n. Hence the formation of each subsequent FEP layer proceeds by spinning on an n-x ferroelectric polymer material over the substrate and at the n-x topology. Next, processing continues by removing ferroelectric polymer material at and near the n-x topology. The algorithm continues by repeating spinning on an n-x ferroelectric polymer material and removing ferroelectric polymer material at and near the n-x topology until n-x sequentially increases to equal n.

Figure 16:
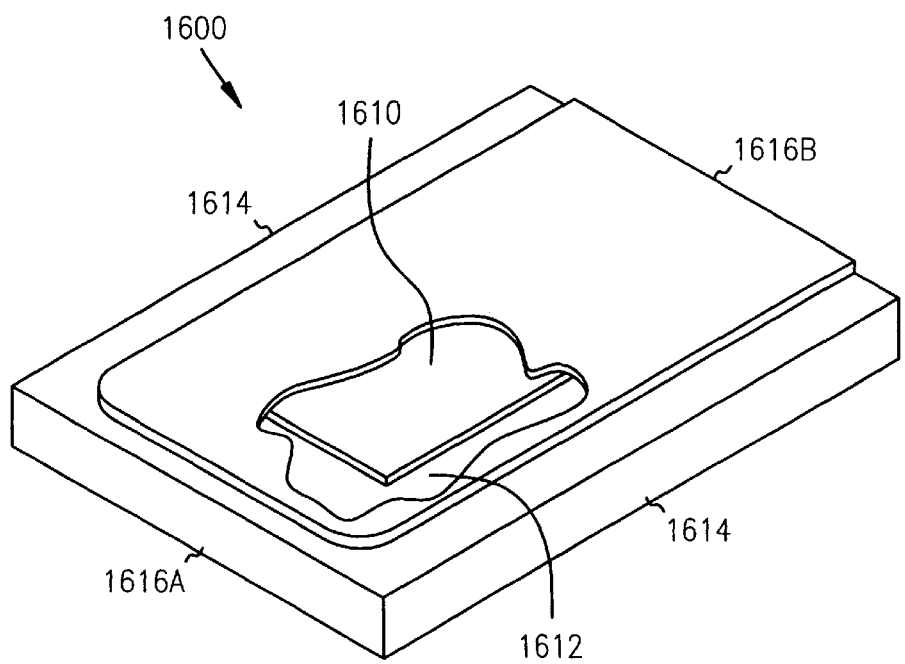
FIG. 16 is an elevational oblique view of a system according to an embodiment.

One embodiment of the present invention is a memory system. FIG. 16 illustrates an elevational oblique view of part of a memory system 1600 that is inserted into a host (not pictured) according to an embodiment of the present invention. The memory system 1600 besides the host (not pictured) may include a polymer memory device 1610 disposed upon a substrate 1612 that may be microprocessor silicon, inorganic ILD material such as silicon oxide, organic ILD material such as polyimide, or others. Alternatively, substrate 1612 may be a board such as a fiberglass-resin (FR) card or motherboard including a current type referred to as FR4.

In FIG. 16, the substrate 1612 is depicted as an FR board that may contain a chip set thereon. A physical interface 1614 for a host is also depicted in FIG. 16. In one embodiment, physical interface 1614 may be the lateral edges of a PCMCIA card as depicted in FIG. 16. In another embodiment the physical interface may be a dual in-line lead frame package that will disposed upon a motherboard, an expansion card, and application-specific integrated circuit (ASIC) board, or the like. A signal interface 1616A, 1616B is also depicted in FIG. 16. In this embodiment, signal interface 1616A may be a female socket bank such as on a PCMCIA card that connects the polymer memory device 1610 to a host. Signal interface 1616B is a jack for a plug-in device such as a telephone or networking cable or the like. In this embodiment, signal interface 1616B may be related to communications technology. Other embodiments of a signal interface 1616B may include optical interfaces including wave guides and spatial transmitter/receiver devices such as an infrared (IR) port for communicating with a handheld device. Other embodiments of a signal interface 1616B may include short-range radiant energy signals such as the technology commonly referred to as Bluetooth.

The data storage portion of the inventive memory system 1600 may include the polymer memory device 1610 that is disposed on the substrate 1612 including the multi-rank, stacked polymer memory device as set forth herein. Other, more specific embodiments of the inventive memory system as set forth herein may be employed.

Various physical interfaces may be employed with the inventive memory system 1600, depending upon the appropriate host. The memory system 1600 may be employed with a physical interface that is configured to a host type selected from communications hosts such as a PCMCIA card interface, a personal data assistant (PDA) interface with or without wireless communication ability, and a hand-held host such as a cellular telephone. Another host type may be a mobile data storage interface that may include a compact flash card interface, a MEMORY STICK® interface made by Sony Corporation, a HIP ZIP® or interface made by Iomega Corporation, a POCKET CONCERT® interface made by Intel Corporation, and others. Another host type may be a removable storage medium interface, a desktop personal computer expansion slot interface, and the like. In each instance, the appearance of the specific physical interface 1614 will vary to take on the requisite receptacle, etc. of the host. Similarly, the appearance of the specific signal interface 1616A, 1616B will vary to take on the requisite connector, etc. of the host.

For example, a PCMCIA card has a physical interface comprising at least the long edges of the card that frictionally and slidingly connect with the card bay. The signal interface for a PCMCIA card comprises at least the female multi-contact sockets at the back of the card, and the specific plug-in outlets at the front of the card. In some embodiments, the system may comprise at least two multiple-layer polymer memory devices.

Low operating voltages are preferred and achieved by embodiments of the present invention. According to an embodiment, switching voltage may be in the range from about 0.5 V to less than about 9 V. Nonvolatile memory such as flash may require charge pump technology to achieve a sufficient voltage to write to the floating gate. The present invention presents a low-voltage technology for nonvolatile memory that may obviate the need for charge pump technology and other higher-voltage memory technologies.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A polymer memory device comprising:
   a first ferroelectric polymer structure disposed on a substrate; and
   a subsequent ferroelectric polymer structure disposed over the first ferroelectric polymer structure, wherein the first ferroelectric polymer structure has a first dimension, and wherein the subsequent ferroelectric polymer structure is concentrically disposed over the first ferroelectric polymer structure, and wherein the subsequent ferroelectric polymer structure is larger than the first ferroelectric polymer structure.

2. The polymer memory device according to claim 1, wherein the first ferroelectric polymer structure and a subsequent ferroelectric polymer structure further comprise:
   a first electrode disposed over the substrate;
   a first ferroelectric polymer layer disposed over the first electrode;
   a second electrode disposed over the first ferroelectric polymer layer;
   a second ferroelectric polymer layer disposed over the second electrode; and
   a third electrode disposed over the second ferroelectric polymer layer.

3. The polymer memory device according to claim 2, wherein the electrodes have a width that is a minimum feature of a photolithography technology, selected from 0.25 micron, 0.18 micron, 0.13 microns and 0.11 micron.

4. The polymer memory device according to claim 1, wherein the first ferroelectric polymer structure and a subsequent ferroelectric polymer structure further comprise:
   a first electrode disposed over the substrate;
   a first ferroelectric polymer layer disposed over the first electrode;
   a second electrode disposed over the first ferroelectric polymer layer;
   a second ferroelectric polymer layer disposed over the second electrode;

a third electrode disposed over the second ferroelectric polymer layer;

a third ferroelectric polymer layer disposed over the third electrode;

a fourth electrode disposed over the third ferroelectric polymer layer;

a fourth ferroelectric polymer layer disposed over the fourth electrode;

a fifth electrode disposed over the fourth ferroelectric polymer layer;

a fifth ferroelectric polymer layer disposed over the fifth electrode; and a sixth electrode disposed over the fifth ferroelectric polymer layer.

5. The polymer memory device according to claim 1, wherein the first ferroelectric polymer structure and the subsequent ferroelectric polymer structures further comprise:

at least one composition selected from $(CH_2-CF_2)_n$ polymer, $(CHF-CF_2)_n$, polymer, $(CF_2-CF_2)_n$, polymer, α-, β-, γ-, and δ-phases thereof, $(CH_2-CF_2)_n-(CHF-CF_2)_m$ copolymer, α-, β-, γ-, and δ-phases thereof, and combinations thereof.

6. The polymer memory device according to claim 1, wherein the first ferroelectric polymer structure and the subsequent ferroelectric polymer structures further comprise:

at least one composition selected from polymers and copolymers of polyethylene fluorides, polyvinyl and polyethylene chlorides, polyacrylonitriles, polyamides, and combinations thereof.

7. A memory system comprising:

a substrate disposed over a physical interface for a host;

a polymer memory device disposed on the substrate, the polymer memory device comprising:

a first ferroelectric polymer structure disposed on the substrate; and at least one subsequent ferroelectric polymer structure disposed over the first ferroelectric polymer structure, wherein the at least one subsequent ferroelectric polymer structure is larger than the first ferroelectric polymer structure; and a signal interface for communication from the memory article to the host.

8. The memory system according to claim 7, wherein the physical interface is configured to a host interface that is selected from a PCMCIA card interface, a compact flash card interface, a memory stick-type card interface, a desktop personal computer expansion slot interface, and a removable medium interface.

9. The memory system according to claim 7, further comprising:

a chip set comprising at least two multiple-rank polymer memory devices.

10. A method, comprising;

forming a first electrode over a substrate;

forming a ferroelectric memory layer over the first electrode;

forming a second electrode over the first ferroelectric memory layer; and forming a second ferroelectric memory layer over the first ferroelectric memory layer, wherein the second ferroelectric memory layer is larger than the first ferroelectric memory layer.

11. The method of claim 10, wherein the second ferroelectric memory layer is formed so that a thickness of the first ferroelectric memory layer is substantially equal to a thickness of the second ferroelectric memory layer and so that a width of the second ferroelectric memory layer is greater than a width of the first ferroelectric memory layer.

12. The method of claim 10, wherein forming the ferroelectric memory layer includes forming a ferroelectric polymer memory layer by spin-on deposition, chemical vapor deposition, substrate dip deposition, Langmuir-Blodgett deposition, or spray-on deposition and further comprising etching a portion of the ferroelectric polymer memory layer.

13. A method, comprising:

forming a structure having a cavity, wherein the structure is formed by:

forming a first electrode material over a substrate;

forming a first dielectric material over the substrate and adjacent the first electrode material;

forming a second electrode material over the first dielectric material, wherein portions of the first electrode material, the first dielectric material, and the second electrode material define the cavity; and forming a first ferroelectric memory layer in the cavity over the first electrode material and after forming the second electrode material.

14. The method of claim 13, further including:

forming a second ferroelectric memory layer in the cavity and over the first ferroelectric memory layer, wherein a volume of the second ferroelectric memory layer is greater than a volume of the first ferroelectric memory material; and forming a third ferroelectric memory layer in the cavity and over the second ferroelectric memory layer, wherein a volume of the third ferroelectric memory layer is greater than a volume of the second ferroelectric memory material.

15. The method of claim 13, wherein forming the first ferroelectric memory layer includes forming a ferroelectric polymer memory layer by spin-on deposition, chemical vapor deposition, substrate dip deposition, Langmuir-Blodgett deposition, or spray-on deposition.

16. An apparatus, comprising:

a first electrode over a substrate;

a ferroelectric memory layer over the first electrode;

a second electrode over the first ferroelectric memory layer;

a second ferroelectric memory layer over the second electrode, wherein the second ferroelectric memory layer is larger than the first ferroelectric memory layer.

17. The apparatus of claim 16, further comprising:

a third electrode over the second ferroelectric memory layer;

a third ferroelectric memory layer over the third electrode, wherein the third ferroelectric memory layer is larger than the second ferroelectric memory layer;

a fourth electrode over the third ferroelectric memory layer;

a fourth ferroelectric memory layer over the fourth electrode, wherein the fourth ferroelectric memory layer is larger than the third ferroelectric memory layer;

a fifth electrode over the fourth ferroelectric memory layer;

a fifth ferroelectric memory layer over the fourth electrode, wherein the fifth ferroelectric memory layer is larger than the fourth ferroelectric memory layer; and a sixth electrode over the fifth ferroelectric memory layer.

18. The apparatus of claim 16, wherein the second ferroelectric memory layer is substantially centered over the first ferroelectric memory layer.

19. The apparatus of claim 16, wherein a thickness of the first ferroelectric memory layer is substantially equal to a thickness of the second ferroelectric memory layer and a width of the second ferroelectric memory layer is greater than a width of the first ferroelectric memory layer.

20. The apparatus of claim 16, wherein the first and second ferroelectric memory layers are ferroelectric polymer memory layers.

21. A system, comprising:
a wireless device; and
a polymer memory coupled to the wireless devices the polymer memory device comprising:
   a first electrode over a substrate;
   a ferroelectric memory layer over the first electrode;
   a second electrode over the first ferroelectric memory layer;
   a second ferroelectric memory layer over the first ferroelectric memory layer, wherein the second ferroelectric memory layer is larger than the first ferroelectric memory layer.

22. The system of claim 16, wherein the wireless device is a personal data assistant (PDA) with wireless communication ability or a cellular telephone.

* * * * *